United States Patent
Han et al.

(10) Patent No.: US 8,122,387 B2
(45) Date of Patent: Feb. 21, 2012

(54) OPTIMIZING INTEGRATED CIRCUIT CHIP DESIGNS FOR OPTICAL PROXIMITY CORRECTION

(75) Inventors: Geng Han, Yorktown Heights, NY (US); Fook-Luen Heng, Yorktown Heights, NY (US); Jin Fuw Lee, Yorktown Heights, NY (US); Chao Yi Tien, legal representative, Yorktown Heights, NY (US); Rama N. Singh, Yorktown, NY (US)

(73) Assignee: International Business Macines Corporation, Armonk, NY (US)

( * ) Notice: Subject to any disclaimer, the term of this patent is extended or adjusted under 35 U.S.C. 154(b) by 323 days.

(21) Appl. No.: 12/482,504

(22) Filed: Jun. 11, 2009

(65) Prior Publication Data
US 2010/0318956 A1 Dec. 16, 2010

(51) Int. Cl.
*G06F 17/50* (2006.01)
(52) U.S. Cl. .................. 716/50; 716/53; 716/54; 430/5
(58) Field of Classification Search .............. 716/50, 716/53, 54; 430/5
See application file for complete search history.

(56) References Cited

U.S. PATENT DOCUMENTS

| | | | |
|---|---|---|---|
| 5,553,273 A | 9/1996 | Liebmann | |
| 5,553,274 A | 9/1996 | Liebmann | |
| 6,643,616 B1 | 11/2003 | Granik et al. | |
| 7,013,439 B2 | 3/2006 | Robles et al. | |
| 7,028,284 B2 | 4/2006 | Cobb et al. | |
| 7,239,249 B2 | 7/2007 | Stimson et al. | |
| 7,245,354 B2* | 7/2007 | Granik | 355/67 |
| 7,467,072 B2* | 12/2008 | Adam | 703/2 |
| 7,493,590 B1* | 2/2009 | Hess et al. | 716/53 |
| 7,669,175 B2* | 2/2010 | Culp et al. | 716/54 |
| 2009/0307649 A1* | 12/2009 | Pramanik et al. | 716/19 |

* cited by examiner

*Primary Examiner* — Naum Levin
(74) *Attorney, Agent, or Firm* — Law Office of Charles W. Peterson, Jr.; Preston J. Young, Esq.

(57) ABSTRACT

A method of physical design for integrated circuit (IC) chip fabrication, physical design system and program product therefor. A design shape is fragmented into segments for Optical Proximity Correction (OPC) and a harmonic mean of the segments is determined. Electrical intent is determined for the shape and a harmonic mean is determined for the segments. Segments may be moved based on a effect on the harmonic mean from moving the segments, measured using a harmonic mean cost function. Finally segmented shapes are passed to OPC.

21 Claims, 9 Drawing Sheets

OPTIMIZING INTEGRATED CIRCUIT CHIP DESIGNS FOR OPTICAL PROXIMITY CORRECTION

FIELD OF THE INVENTION

The present invention generally relates to fabricating Integrated Circuit (IC) chips and more particularly to Optical Proximity Correction (OPC) design shapes in physical design, whereby an IC design is converted to masks for IC fabrication.

BACKGROUND DESCRIPTION

A typical integrated circuit (IC) chip includes a stack of several levels or sequentially formed layers of shapes of various materials, e.g., metals, semiconductors and insulators. Each layer of shapes, also known as mask levels or mask layers, may be created or printed optically through well known photolithographic exposure and development steps. Typical such patterning steps may include, for example, etching, dopant implanting and material deposition. Each layer is stacked or overlaid precisely on a prior layer and patterned to form the shapes that define devices (e.g., Field Effect Transistors (FETs)) and connect the devices into circuits.

In a typical state of the art complementary insulated gate FET process, such as what is normally referred to as CMOS, the layers are formed on a wafer to form the devices on a surface of the wafer, e.g., a silicon surface layer of a Silicon On Insulator (SOI) wafer. A simple FET is formed by the intersection of two rectangles, a gate layer rectangle on a rectangular silicon island formed from the silicon surface layer. In a typical IC chip each individual FET has physical characteristics that depend, primarily, on intersecting shapes on these two layers. FET current, for example depends on device length and width. Device width may be set by the underlying island, which is a thin oxide/diffusion shape; and device length may be set by the uppermost gate shape, usually a polysilicon line crossing the island, with the width of the line determining the device length.

Normally, a chip designer creates an electrical and/or logic representation of a new circuit that is converted to a chip/circuit layout, e.g., using a general purpose computer, during what is commonly known as physical design. The designer uses device models, based on process parameters and physical structures that are extracted from the design, to demonstrate design performance. Typical such models include, for example, complex mathematical current models for each device that predict whether a particular design is meeting design goals. Once the designer has demonstrated design performance and functionality, the design is passed to physical design. In physical design, the circuit layout is generated and converted to data to print masks for printing chip layers. It is common to lose design shape fidelity printing from masks that have been created directly from the chip/circuit layout.

During printing each shape may be affected by or may affect other shapes in the vicinity. Non-linearities, associated with the various optical and resist patterning tools and materials, cause these shape interactions, which are commonly known as proximity effects. Consequently, physical design involves applying process biases to each shape in the particular chip/circuit layout in what is known as Optical Proximity Correction (OPC). These OPC process biases compensate for these proximity effects by intentionally distorting the drawn shapes such that the mask shapes print substantially as drawn. Using various modern lithographic refinements, e.g., Resolution Enhancement Technology (RET), the mask data from the OPC compensated shapes controls the mask making tool to print photolithographic masks. Finally, the masks are used to print the design pattern onto the wafer.

As mask shapes and spaces have shrunk with increases in technology density, proximity effects have become more prominent and OPC has become more complex. Typically, OPC modifies the drawn layout shapes, strategically adding/removing features. For example, what are known as "flares" and "hammer heads" may be placed at the end of lines to compensate for "line-end shortening" effects. What are called "serifs" may be attached at rectangular corners to compensate for "corner rounding" effects. These shapes are typically added using to formalized rules-based OPC methods or by the more modern Model Based OPC (MBOPC) methods.

In some cases OPC may be uniformly applied to a single shape, e.g., for two parallel lines on minimum pitch; in others, for example where multiple different adjacent shapes affect the same shape differently, OPC is more complex/rigorous. For example, OPC may be applied by dividing each shape edge into several segments. Then each individual segment is distorted or displaced to compensate for the proximity effects. The resulting mask and the associated RET step ensures that the layout drawn shapes are transferred to the silicon wafer with great fidelity. Depending upon the particular design, each of these layers may include several hundreds of millions, even billions, of mask shapes. Since proximity effects may vary from shape to shape, OPC complexity has increased the mask generation computational requirement significantly, requiring both more powerful computing resources and increasing the time required for OPC. This increases mask generation costs and, as a result, IC manufacturing costs as well as the cost of the ICs themselves.

Moreover, once physical design is complete and the masks have been fabricated, each photolithographic mask is used to print the layout pattern onto the semiconductor wafer, defining local wafer properties or one of the chip/circuit layers. If the residual proximity effects cause a single device to fail or match its design goal (e.g., device current falls short of its design current because of device length variations introduced from using too coarse OPC granularity), the circuit will not function as designed and the chip may fail to achieve overall design goals. Failing chips reduce yield and, consequently, also increase IC manufacturing costs as well as the cost of the ICs themselves.

Thus, there is a need for producing IC masks that accurately reflect circuit design intent without complicating the mask design such that computer resources become prohibitive.

SUMMARY OF THE INVENTION

It is a purpose of the invention to simplify OPC;
It is another purpose of the invention to simplify OPC for complex, dense IC designs;
It is yet another purpose of the invention to produce complex, dense ICs that accurately reflect design intent with minimum computer resources dedicated to OPC.

The present invention relates to a method of physical design for integrated circuit (IC) chip fabrication, a physical design system and program product therefor. A drawn design shape for each device is fragmented into segments for Optical Proximity Correction (OPC) and simulated. The harmonic mean of the lengths of segments on the simulated patterned shape is determined from the simulated OPC results. Electrical intent is implicit in this harmonic mean. Segments may be moved based on a cost to the deviation of the harmonic mean from the drawn lengths during the optimization of OPC.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Integrated Circuit (IC) masks made according to a preferred embodiment of the present invention are fabricated focusing Optical Proximity Correction (OPC) on generating masks with fidelity to design intent as determined from device design performance parameters, for example, drain saturation current ($I_{dsat}$), rather than on achieving design intent as a secondary result of fidelity to physical layout as was previously done. Accordingly the present invention may be better understood with reference to FIGS. 1A-D, which show a simple example of residual proximity effects for a small area 100 of an IC chip design (not shown) after traditional OPC.

Figure 1A:
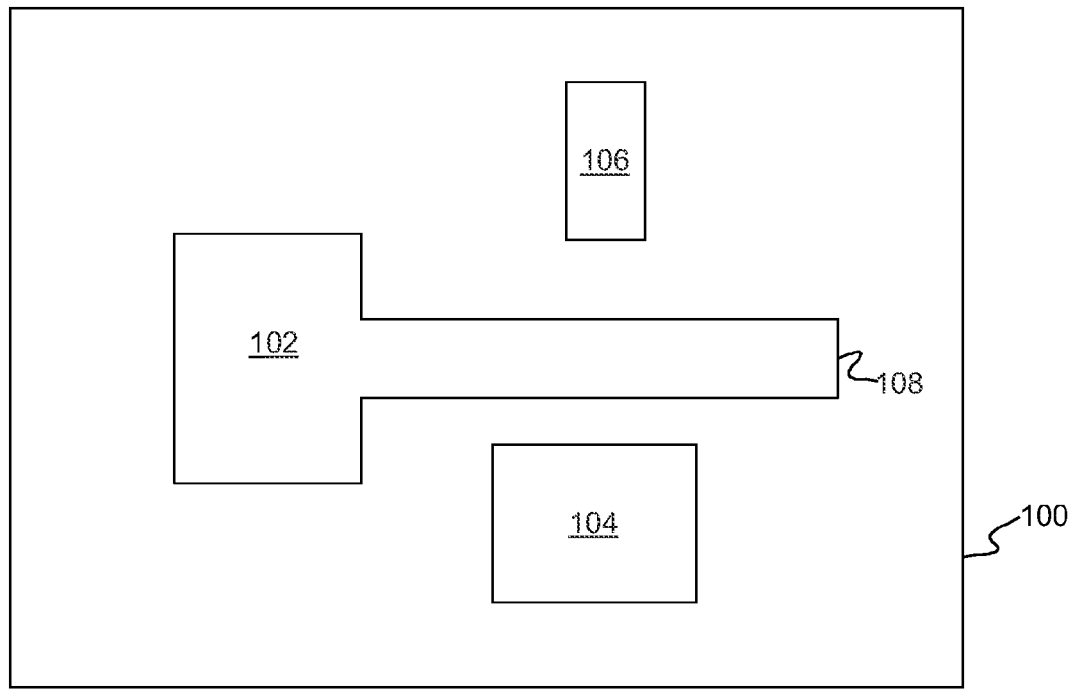
FIG. 1 shows a simple example of proximity effects on a drawn design shape and typical Optical Proximity Correction (OPC) thereof.

As shown in FIG. 1A, this area encompasses drawn or design shapes 102, 104, 106 prior to OPC. Design shape 102 may be a device gate, for example, overlying a thin oxide/diffusion region (not shown). For such a gate shape 102, the shape width, edge 108, defines the device length (L) with device width (W) determined by an underlying thin oxide/diffusion region (also not shown). It should be noted that although described herein with reference to applying OPC to device gate shapes, the present invention has application to OPC applied to any shape or layer of shapes where OPC is required to arrive at shapes that reflect design intent. So, for example, the present invention may have application to OPC for wiring layers (wires connecting devices into circuits and connecting circuits together) that may end with irregular physical design shapes due to proximity effects. Without OPC, proximity effects from adjacent/nearby shapes 102, 104, 106 cause additional localized exposure to the shape 102, 104, 106, extending portions of the shape boundaries.

Figure 1B:
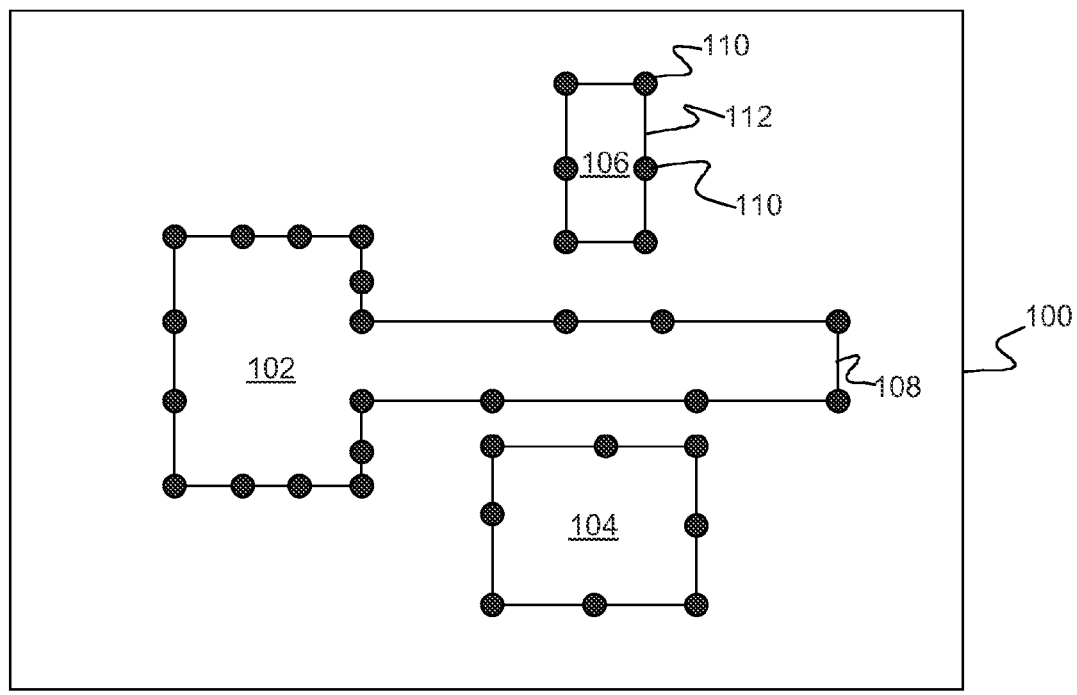

So to print the mask accurately, as shown in FIG. 1B, the design shapes 102, 104, 106 are fragmented during OPC, e.g., into butting adjacent rectangles, at vertices 110, with pairs of vertices defining each fragment, e.g., 112. Further, each edge is shifted during OPC as shown in FIG. 1C, with shapes 102', 104', 106' reflecting proximity corrected shapes to be printed onto a mask and, ideally, when the mask is printed onto a semiconductor wafer, the shapes 102, 104, 106 print as reflected in FIG. 1A.

Figure 1C:
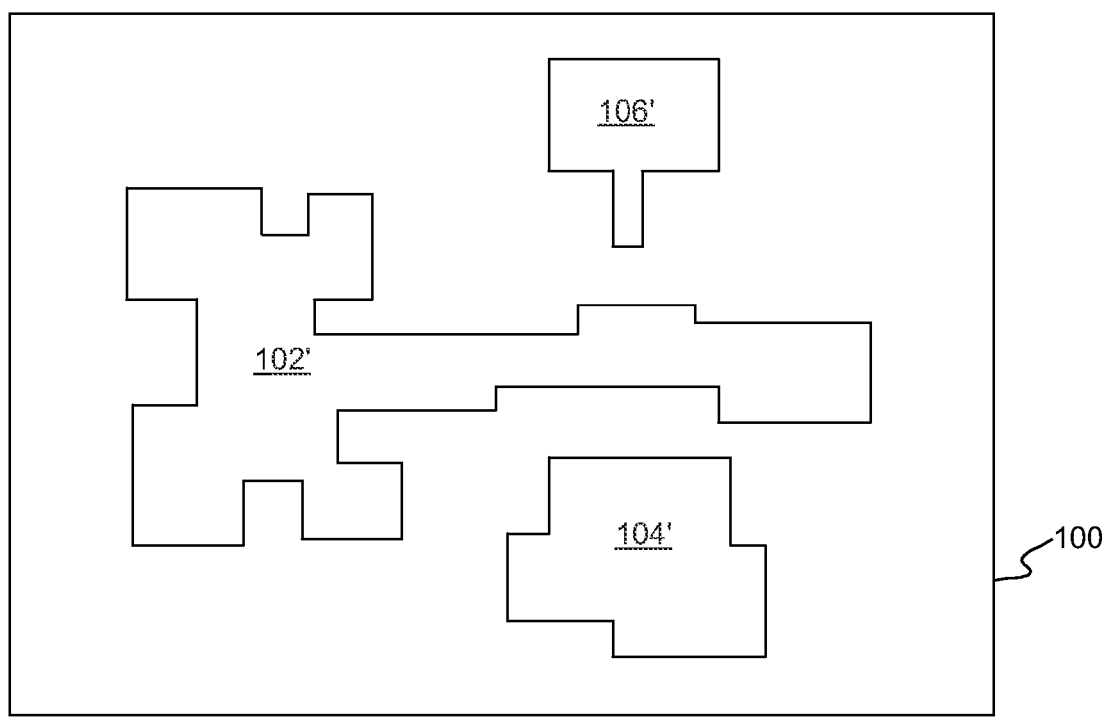
Figure 1D:
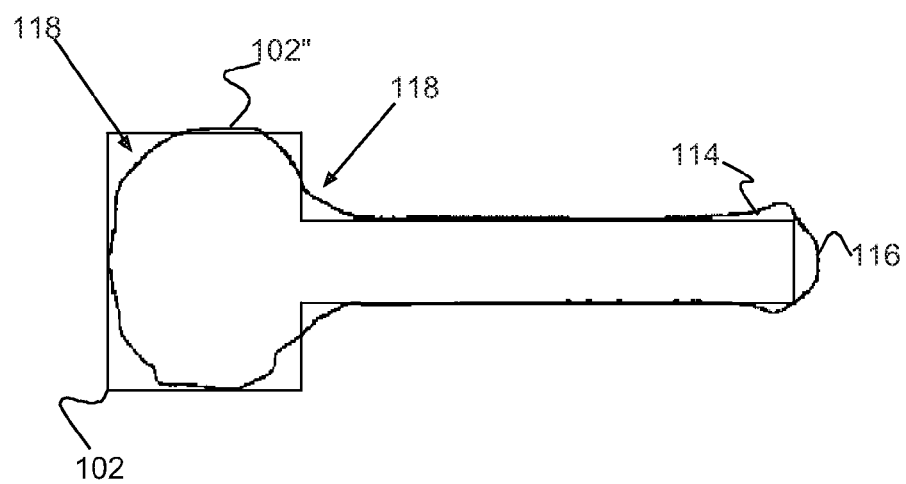

Even after traditional OPC, however, as shown in FIG. 1C with design shape 102 superimposed over printed shape 102", printing may still cause blooming 114. Also, shape end edges 116 in open areas, e.g., at either end, may pull back or foreshorten (not shown). Further, what is known as corner rounding may occur, e.g., 118, at internal and external corners. It is apparent from printed shape 102" of this example that printing the design shape 102 with traditional OPC results in a device with a piecewise varying device length with the length varying with shape width.

By applying successive iterations of traditional OPC to the (projected) printed shape 102", one may arrive at reasonably converged mask shapes and mask that prints drawn shapes (e.g., 102, 104, 106) with good fidelity with some remaining residual effects. Since circuit performance is primarily dependent upon device current, i.e., the current available to drive circuit loads, and since device current is inversely proportional to device length (i.e., to W/L), residual effects or an imperfect OPC may result in a device that is unlikely to perform as designed. Furthermore, traditional OPC introduces mask corrections to ensure geometric fidelity while ignoring electrical fidelity metrics, i.e., circuit design functionality and performance considerations. This is because with traditional OPC, including electrical fidelity metrics could increase OPC complexity simply to converge on geometric fidelity, i.e., getting the finally printed shape conform to the drawn shape 102.

So typically, in prior art mask generation approaches divided design shapes (e.g., 102) into smaller relevant fragments (than in the example of FIGS. 1B and C), incrementally shifting fragment edges in appropriate directions to ensure that the printed shapes match the design. For example, placing notches where blooming is expected allows the blooming to fill the notches; or, lengthening ends allows the foreshortening to pull the ends back to intended positions. Typically, selecting these fragments and edge shifts are the result of simulation and modeling optical proximity effects on the design to correspond drawn physical layout with the finally formed shapes. While these approaches may still be somewhat effective, the primary focus was on replicating the design shapes to ensure the designer's intent, i.e., actual device/circuit performance. Thus, these approaches increased mask shape complexity just to ensure that printed shapes correspond to drawn/design counterparts. The more complex the mask, the more time consuming to make and, correspondingly, more expensive to produce.

Heng et al., "Toward Through-Process Layout Quality Metrics," *Proceedings of the SPIE*, Vol. 5756, pp. 161-167, May 13, 2005, describes an approach that is more design performance centric, albeit also more complex. Heng et al. teaches deriving an equivalent gate length and width from a simulated contour of each device shape by slicing the nonrectangular device into a set of elemental rectangular devices. Then, the integrated drain saturation current ($I_{dsat}$) may be determined from these equivalent elements using compact device models. Using the well known relationship between device saturation current for given device conditions (e.g., gate, source and drain voltages) and device width and length, an equivalent gate length and width of a rectangular device may be determined that produces $I_{dsat}$ equal to the integrated value. While this equivalent gate length and width may be used in circuit simulators to predict circuit performance, calculating each and every fragment is still very complicated and time consuming for a typical multi-device (with 10s or 100s of devices) circuit.

Figure 2:
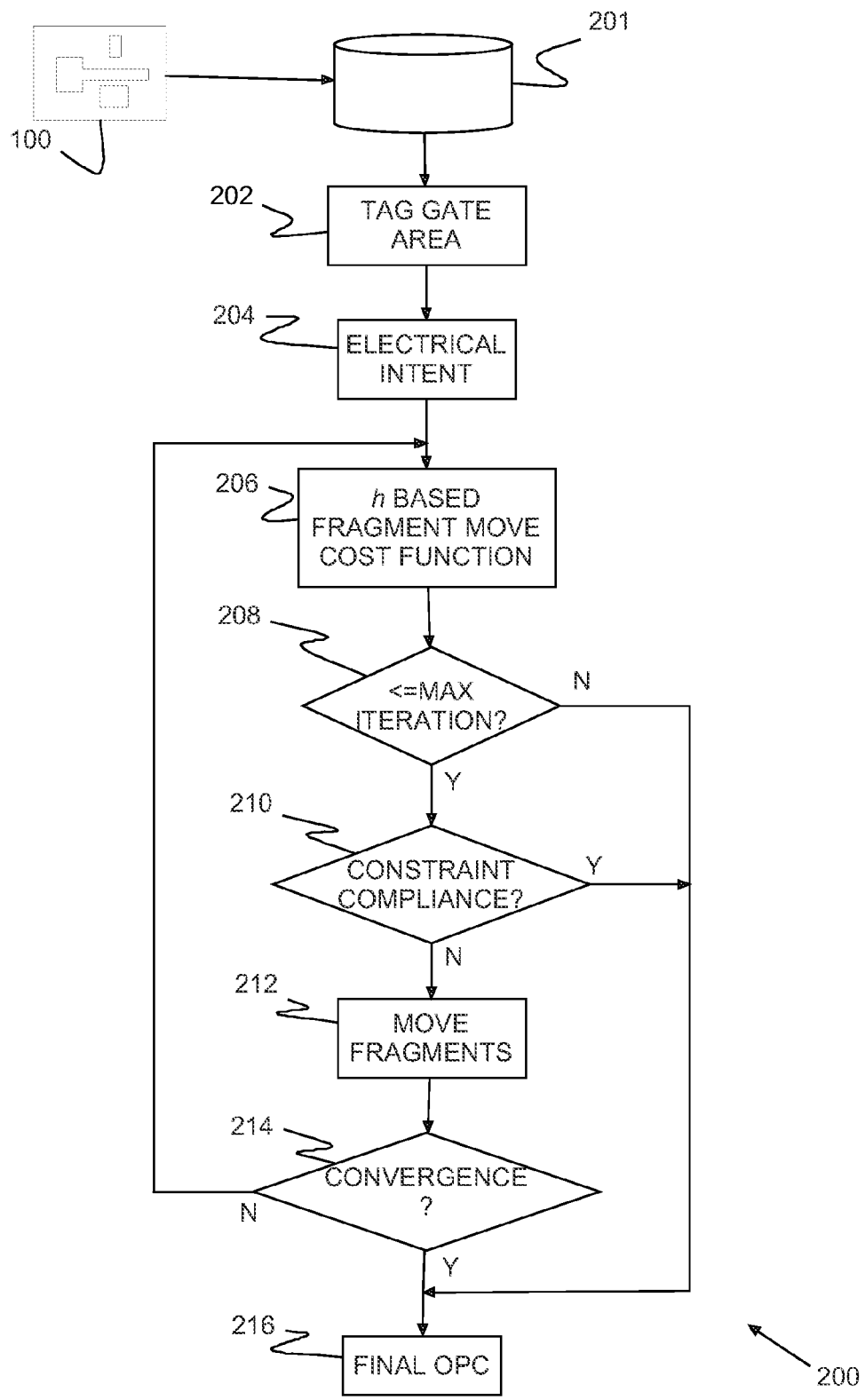
FIG. 2 shows a flow diagram example of OPC using a geometrical harmonic mean approximation to mimic circuit transistor behavior, while ensuring design intent according to a preferred embodiment of the present invention.

However, FIG. 2 shows a flow diagram example 200 of OPC using a geometrical approximation to mimic circuit transistor behavior, while ensuring design intent to efficiently arrive at equivalent gate lengths by a simple geometric measurement, according to a preferred embodiment of the present invention. First the design (e.g., the chip including area 100) is received, e.g., from storage 201 and in step 202, the shape area, e.g., a shape (102 in FIG. 1A) for a FET gate, is tagged for OPC, e.g., identifying gate lengths, effectively, for a piecewise gate length. So, for example, the gate is fragmented (e.g., at vertices 110 in FIG. 1B) for OPC. Next, in step 204, the resulting fragmented shapes are simulated to generate patterned shapes, e.g., 102', 104', 106', in FIG. 1C. The electrical intent of each device is determined by the harmonic mean (h) determined from the segment lengths of the patterned shapes 102', 104', 106', as described in more detail hereinbelow. During OPC optimization in step 206, a cost function is determined for moving segments. A preferred cost function may be, for example, the sum of squares of the deviation of the harmonic mean gate length from the drawn length.

To limit time and resources consumption, determining h is limited to use on critical devices and for a selected maximum number of iterations for any one shape, checking progress at each iteration as to whether OPC is optimal. So in step 208, the cost function is checked to determine if the current iteration has resulted in a cost function improvement, i.e., the current value is lower than the previous; and if current value is less than the previous, OPC iteration continues to step 210. In step 210 the cost function is checked to determine if it complies with all predefined/preselected OPC constraints, e.g. to avoid bridging and necking. If the cost function improved but the mask failed to comply with OPC constraints, then proceeding to step 212, device fragments (an edge 112 and its vertices 110 in FIG. 1B) are moved and again in step 214 the result is checked to see if it is converging, e.g., the cost function is improving and the mask is adhering to constraints. For example, the current result is checked against the previous result to determine whether the difference is smaller than some maximum difference ($\delta$). If the difference is larger than $\delta$, then a solution has not yet been reached and returning to step 206, the cost function is recalculated based on the current fragment locations and on the geometrical or harmonic mean approximation, and OPC continues. It should be noted that $\delta$ may be an absolute value, a ratio (percentage) of the difference to the current value, or any other suitable measurement that may be selected.

Using harmonic mean approximation concludes for devices in step 216, with final OPC after either reaching a selected maximum number of iterations in step 208; if in step 210 the mask is in compliance with OPC constraints; and/or, if the cost function did not improve in step 214. These checks for exceeding the selected maximum number of iterations 208, for compliance with constraints 210 and for convergence 214 select a final solution that may be inserted or removed from the flow as desired. Accordingly, by using harmonic mean approximation for OPC according to a preferred embodiment of the present invention, RET/OPC recipes may be generated for a design without complicating the resulting masks and further, limiting the mask shape complexity to be no more complex than what is necessary to meet electrical design intent.

Figure 3:
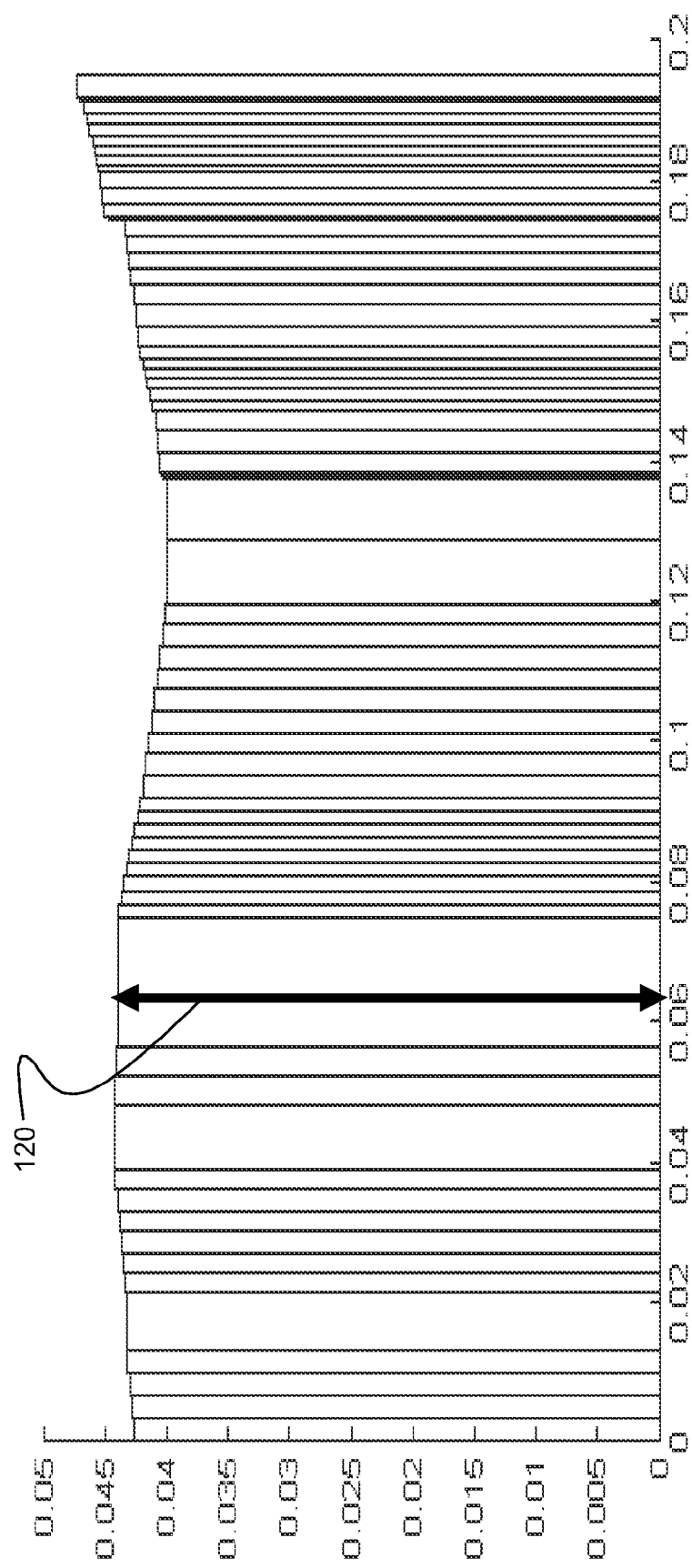
FIG. 3 shows an example of gate fragment lengths of elemental fragment rectangles of a nonrectangular device gate, fragmented and placed for design intent based on harmonic mean of the lengths and plotted against device fragment widths.

FIG. 3 shows an example of gate fragment lengths ($L_i$) of elemental fragment rectangles of a nonrectangular device gate, fragmented and placed for design intent as described in FIG. 2 and plotted against device fragment widths ($W_i$). In this example, the $i^{th}$ device fragment 120 has width $W_i$ (abscissa) and length $L_i$ (ordinate axis). According to a preferred embodiments, the harmonic mean is the inverse of the sum of fragment device width to length ratios ($W_i/L_i$) divided by the sum of fragment device widths, i.e., $$\frac{1}{h} = \frac{\sum_i \frac{W_i}{L_i}}{\sum_i W_i}.$$

Since device saturation current is inversely proportional to device length, using the harmonic mean of the gate lengths at strategically selected device shape fragments can mimic the $I_{dsat}$ with reasonable accuracy. So once determined, the harmonic mean can be used alone or in combination with traditional OPC constraints, using the harmonic mean to drive the RET/OPC and the fabrication process with the circuit's electrical intent. Moreover, using the harmonic mean approximation minimizes unnecessary mask shape complexity over prior approaches, while insuring that resulting masks are complex enough to meet the design intent.

Figure 4:
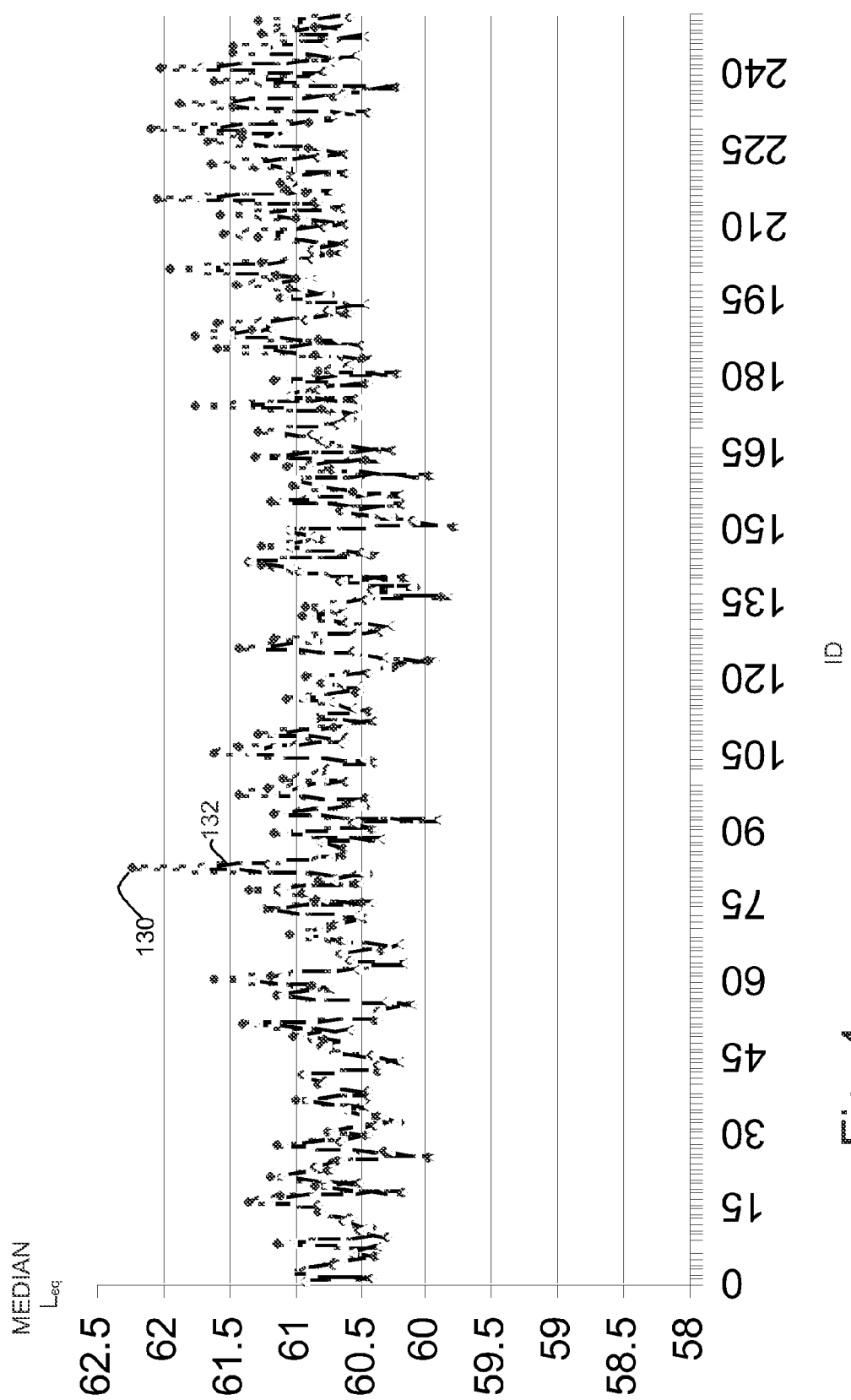
FIG. 4 shows an example comparing circuit design gate lengths determined based on $I_{dsat}$ with harmonic mean determination.

FIG. 4 shows an example comparing circuit design gate lengths determined using the more complex computer intensive approach based on $I_{dsat}$ 130 against the more efficient, preferred harmonic mean determination 132 as described in FIG. 2, for example. The circuit of this example, a local clock buffer (LCB), includes more than 250 devices with each value representing median equivalent length ($L_{eq}$ in nanomenters (nm)), the median calculated over the process window, for each of the identified (ID) devices in the circuit. Thus, it is apparent for this example that the two methods exhibit much less than a 1% difference in median equivalent length for approximately 90% of the devices.

Figure 5A:
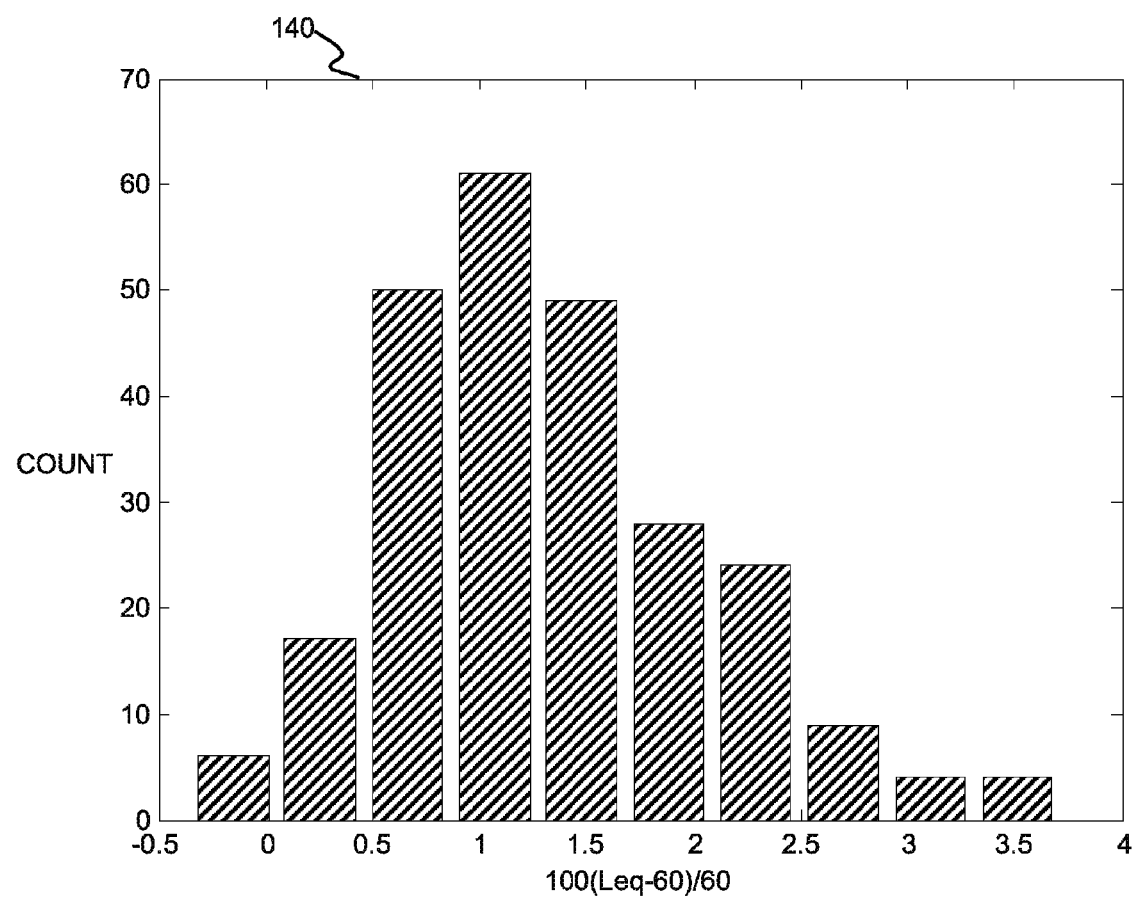
FIGS. 5A-B show histograms of gate length process variability for the LCB devices, comparing using delay against harmonic mean.
Figure 5B:
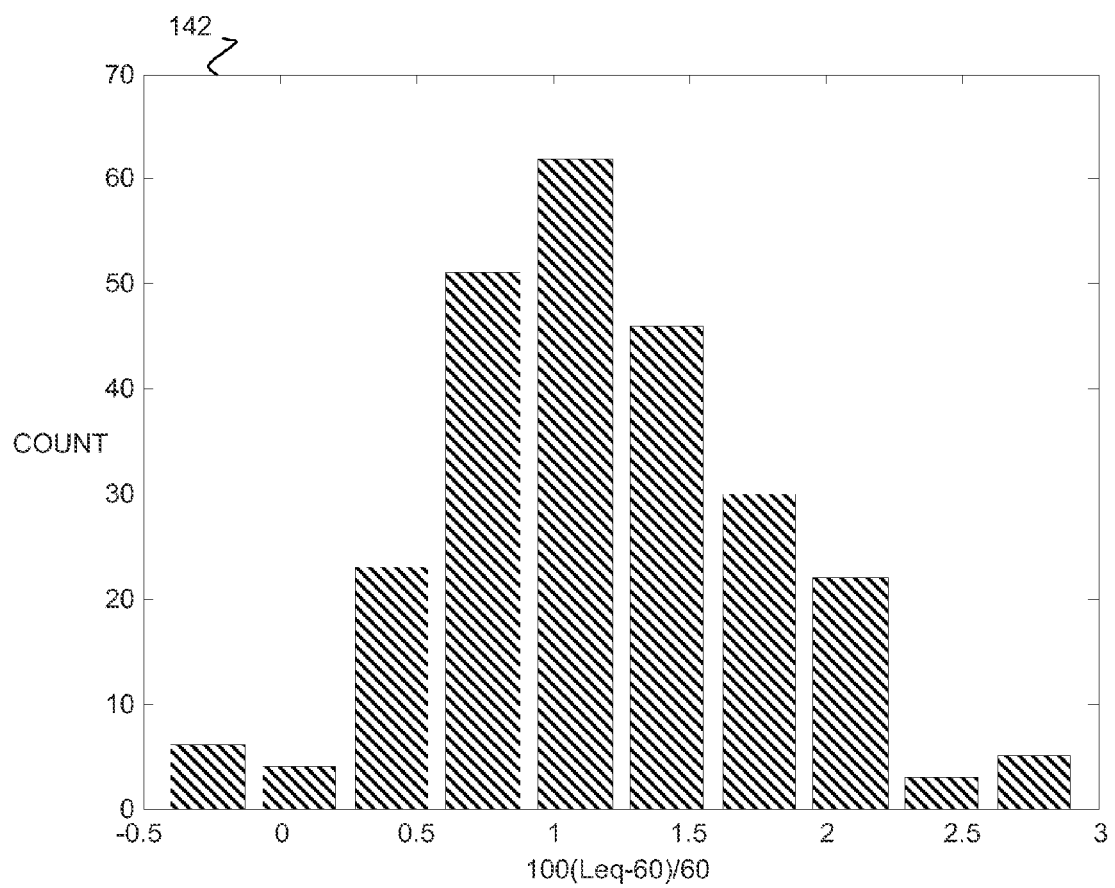

FIGS. 5A-B show histograms of gate length process variability for the same LCB devices, comparing using the prior delay approach 140 (also more complex and computer intensive) against the preferred harmonic mean approach 142. In this example the device $L_{eq}$ variability is offset by 60 nm and normalized to 60 nm., i.e. $100(L_{eq}-60 \text{ nm})/60$ nm. Thus it is apparent that the same 250 devices of FIG. 3, exhibit a much tighter distribution using the preferred harmonic mean approach over the prior art delay approach.

Figure 6A:
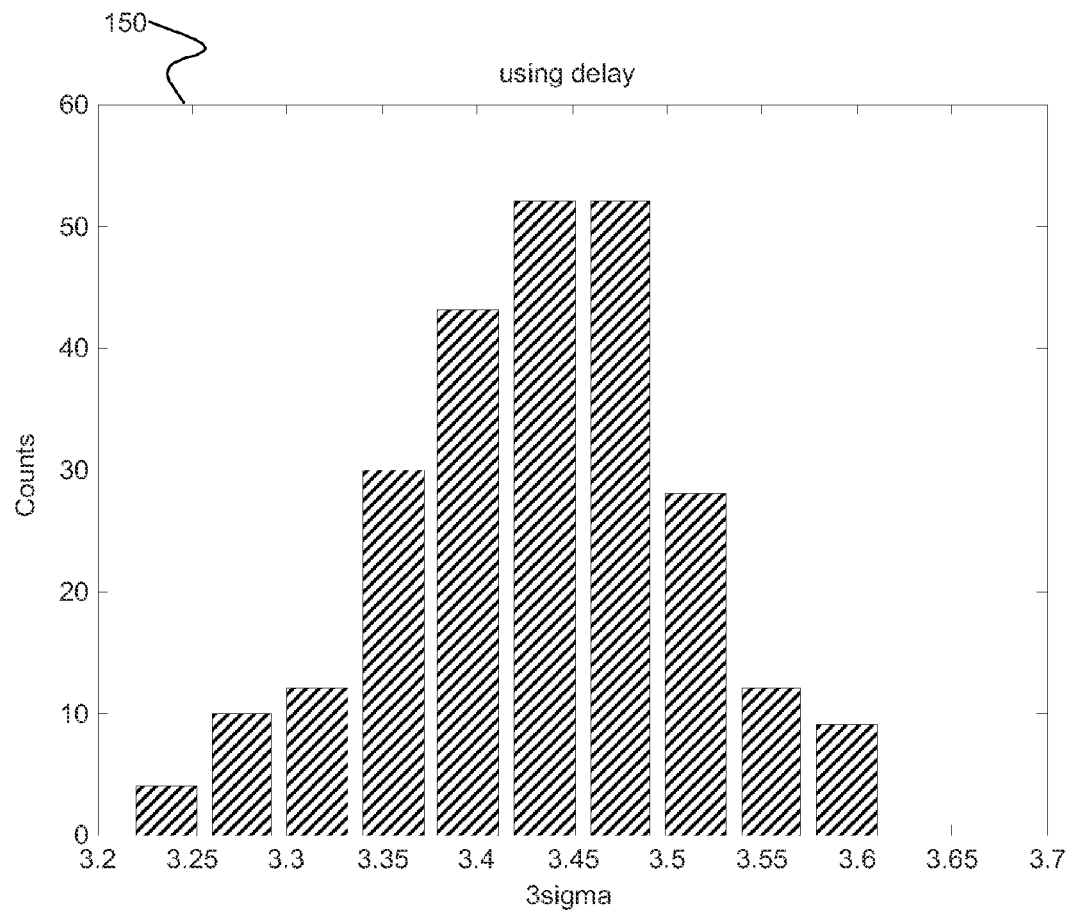
FIGS. 6A-B show a comparison of histograms of standard deviations of device variability, comparing results from using $I_{dsat}$ versus harmonic mean.
Figure 6B:
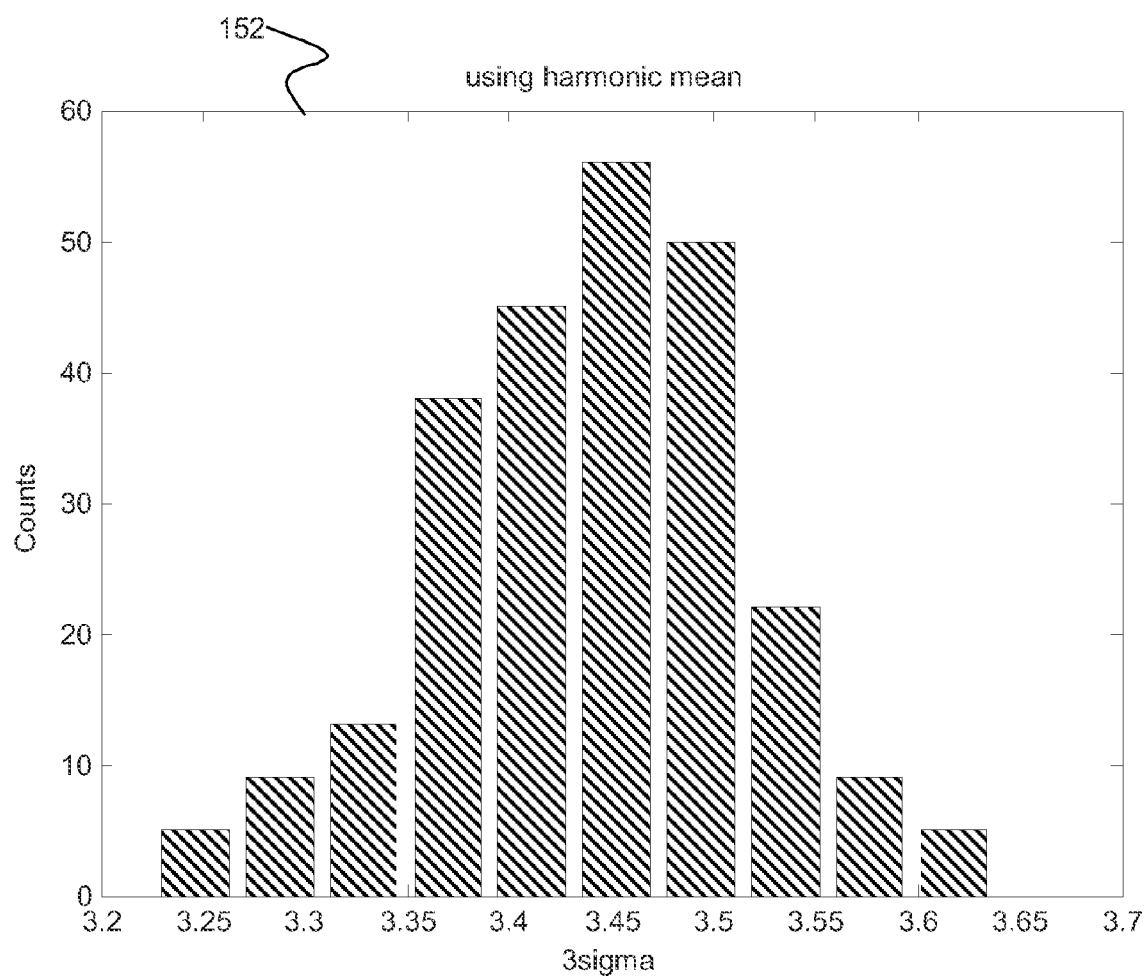

This is further bourn out by the histograms of FIGS. 6A-B, which show a comparison of standard deviations 150, 152 of device variability for the same two methods, respectively. Clearly from this example, using the harmonic mean 152 to closely mimic the more rigorous equivalent gate length computation 150. Thus, the present invention provides an efficient and easily geometrically computed method for determining and capturing a circuit designer's electrical intent for RET/OPC algorithms.

Advantageously, the present invention focuses OPC on generating masks with fidelity to design intent as determined from device design performance parameters, for example, drain saturation current, rather than based on achieving design intent as a secondary result of fidelity to physical layout. So, unlike prior art approaches to physical layout that use a weighted sum of Edge-Placement-Error (EPE) cost function applied at strategically selected shape edge fragments; masks made according to a preferred embodiment of the present invention produce circuits and ICs that accurately reflect and have a direct correlation to the circuit designer's electrical intent. Furthermore, the present invention arrives at an OPC result efficiently and quickly, without significantly increasing computational resource overhead and without overly complication the resulting masks.

While the invention has been described in terms of preferred embodiments, those skilled in the art will recognize that the invention can be practiced with modification within the spirit and scope of the appended claims. It is intended that all such variations and modifications fall within the scope of the appended claims.

What is claimed is:

1. A method of physical design for integrated circuit (IC) chips, said method comprising:
providing an IC design to a computer for physical design;
tagging a design shape from said IC design for proximity effects;
determining electrical intent for said design shape;
determining a harmonic mean based cost function for moving segments, wherein the harmonic mean is the inverse of the sum of fragment device width to length ratios divided by the sum of fragment device widths;
moving segments based on said cost function; and
passing said segments to proximity correction.

2. A method of physical design as in claim 1, wherein determining electrical intent further comprises determining a harmonic mean (h) for all of the shape segments.

3. A method of physical design as in claim 2, wherein each segment has a width $W_i$, length $L_i$ and width to length ratio ($W_i/L_i$) and h has the form $$\frac{1}{h} = \frac{\sum_i \frac{W_i}{L_i}}{\sum_i W_i}.$$

4. A method of physical design as in claim 2, wherein determining the harmonic mean based cost function comprises determining the sum of squares of the deviation of the harmonic mean gate length from the drawn length.

5. A method of physical design as in claim 1, before moving segments further comprising:
checking whether segments have been moved more than a selected maximum number of iterations; and responsive to finding said selected maximum
proceeding to passing said segments.

6. A method of physical design as in claim 1, before moving segments further comprising:
checking whether the harmonic mean based cost function complies with selected Optical Proximity Correction (OPC) constraints; and responsive to finding compliance
proceeding to passing said segments.

7. A method of physical design as in claim 1, before moving segments further comprising:
checking whether segment placement has converged; and responsive to finding said convergence
proceeding to passing said segments.

8. A physical design system for integrated circuit (IC) chip design, said physical design system comprising:
means for providing an IC design for physical design;
means for segmenting design shapes from said IC design for proximity effects;
means for determining electrical intent for said design shapes;
means for determining a harmonic mean based cost function for moving design shape segments, wherein the harmonic mean is the inverse of the sum of fragment device width to length ratios divided by the sum of fragment device widths;
means for moving design shape segments responsive to said cost function; and
means for passing said segmented design shapes to proximity correction.

9. A physical design system as in claim 8, wherein the means for determining electrical intent further comprises means for determining a harmonic mean (h) for all of the shape segments of each of a plurality of design shapes.

10. A physical design system as in claim 9, wherein each segment has a width $W_i$, length $L_i$ and width to length ratio ($W_i/L_i$) and h has the form $$\frac{1}{h} = \frac{\sum_i \frac{W_i}{L_i}}{\sum_i W_i}.$$

11. A physical design system as in claim 9, wherein the means for determining the harmonic mean based cost function comprises means for determining the sum of squares of the deviation of the harmonic mean gate length from the drawn length.

12. A physical design system as in claim 8, further comprising means for checking whether segments have been moved more than a selected maximum number of iterations.

13. A physical design system as in claim 8, further comprising means for checking whether the harmonic mean based cost function complies with selected Optical Proximity Correction (OPC) constraints.

14. A physical design system as in claim 8, further comprising means for checking whether segment placement has converged.

15. A computer program product for integrated circuit (IC) physical design system, said computer program product comprising a non-transitory computer
having computer readable program code for execution by a computer stored thereon, said readable program code comprising:
computer readable program code means for providing an IC design for physical design;
computer readable program code means for segmenting design shapes from said IC design for proximity effects;
computer readable program code means for determining electrical intent for said design shapes;
computer readable program code means for determining a harmonic mean based cost function for moving design shape segments, wherein the harmonic mean is the inverse of the sum of fragment device width to length ratios divided by the sum of fragment device widths;
computer readable program code means for moving design shape segments responsive to said cost function; and
computer readable program code means for passing said segmented design shapes to proximity correction.

16. A computer program product for IC physical design system as in claim 15, wherein the computer readable program code means for determining electrical intent further comprises computer readable program code means for determining a harmonic mean (h) for all of the shape segments of each of a plurality of design shapes.

17. A computer program product for IC physical design system as in claim 16, wherein each segment has a width $W_i$, length $L_i$ and width to length ratio ($W_i/L_i$) and h has the form $$\frac{1}{h} = \frac{\sum_i \frac{W_i}{L_i}}{\sum_i W_i}.$$

18. A computer program product for IC physical design system as in claim 16, wherein the computer readable program code means for determining the harmonic mean based cost function comprises computer readable program code means for determining the sum of squares of the deviation of the harmonic mean gate length from the drawn length.

19. A computer program product for IC physical design system as in claim 15, further comprising computer readable program code means for checking whether segments have been moved more than a selected maximum number of iterations.

20. A computer program product for IC physical design system as in claim 15, further comprising computer readable program code means for checking whether the harmonic mean based cost function complies with selected Optical Proximity Correction (OPC) constraints.

21. A computer program product for IC physical design system as in claim 15, further comprising computer readable program code means for checking whether segment placement has converged.

* * * * *